United States Patent [19]

Liaw et al.

[11] Patent Number: 5,371,046
[45] Date of Patent: Dec. 6, 1994

[54] METHOD TO SOLVE SOG NON-UNIFORMITY IN THE VLSI PROCESS

[75] Inventors: Yung-Haw Liaw; Hsin-Chieh Huang, both of Hsin-Chu; Pao-Ling Kuo, Taipei, all of Taiwan, Prov. of China

[73] Assignee: Taiwan Semiconductor Manufacturing Company, Hsinchu, Taiwan, Prov. of China

[21] Appl. No.: 94,705

[22] Filed: Jul. 22, 1993

[51] Int. Cl.$^5$ .......................................... H01L 21/465
[52] U.S. Cl. ..................................... 437/231; 437/195
[58] Field of Search ................................. 437/195, 231

[56] References Cited

U.S. PATENT DOCUMENTS

| | | | |
|---|---|---|---|
| 5,106,787 | 4/1992 | Yen | 437/231 |
| 5,250,472 | 10/1993 | Chen et al. | 437/231 |
| 5,270,267 | 12/1993 | Ouellet | 437/231 |

FOREIGN PATENT DOCUMENTS 91009422  6/1991  WIPO ................... 437/231

OTHER PUBLICATIONS

CRC Handbook of Chemistry and Physics, 64th Ed (1983–84), Robert Weast (Ed.), CRC Press, Boca Raton, Fla., p. F–102.

*Primary Examiner*—Olik Chaudhuri
*Assistant Examiner*—Ken Horton
*Attorney, Agent, or Firm*—George O. Saile

[57] ABSTRACT

A new method of planarizing an integrated circuit is described. A first coating of a silicate spin-on-glass material is applied to the surface of a patterned conductor layer to be planarized. The spin-on-glass material is applied under low relative humidity, filling the valleys of the irregular structure of the conductor layer. The first spin-on-glass layer is covered with a second coating of the spin-on-glass material also applied under low relative humidity. Then, both first and second spin-on-glass layers are cured. This method provides a uniform spin-on-glass dielectric layer upon which a second conductor layer may now be successfully applied.

9 Claims, 1 Drawing Sheet

METHOD TO SOLVE SOG NON-UNIFORMITY IN THE VLSI PROCESS

BACKGROUND OF THE INVENTION (1) Field of the Invention

The invention relates to a method of planarizing an integrated circuit device, and more particularly, to a method of planarizing a submicron integrated circuit device which avoids spin-on-glass non-uniformity defects.

(2) Description of the Prior Art

As devices shrink to the submicron level, interconnects between these devices become finer. Planarized dielectric film must be formed between the metal layers of an integrated circuit in order to achieve good metallization step coverage of the fine interconnects. Spin-on-glass has been used widely for the dielectric film after its curing to silicon oxide. The material to be applied is thoroughly mixed in a suitable solvent. The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Most of the vehicle or solvent is driven off by a low temperature baking step often followed by vacuum degassing. Other coatings of the spin-on-glass material may be applied, baked and vacuum degassed until the desired spin-on-glass thickness layer is formed. The final step in the making of the spin-on-glass layer is curing. Curing is a high temperature heating step to cause the breakdown of the spin-on-glass material to a silicon dioxide like cross linked material.

Serious non-uniformity defects can be inspected after the second coating of the spin-on-glass material if the first coating was not cured prior to the application of the second coating. The non-uniformity appears especially on bond pads, guard rings, and thin metal lines. The root cause of the non-uniformity is that the first coated film reacts insufficiently with the surface of the underlayer, usually a plasma-enhanced silicon oxide. There are two possible solutions to the non-uniformity problem. The first solution is to cure the first spin-on-glass layer before the second layer is applied, and then to cure the second layer after it is deposited. The drawbacks of this solution are that it is too costly and time consuming. The second solution is completely unexpected and is the subject of the present invention. The solution is to apply the spin-on-glass material under a low relative humidity process.

SUMMARY OF THE INVENTION

A principal object of the present invention is to provide an effective and very manufacturable method of planarizing a submicron integrated circuit wherein there are no non-uniformity defects in the planarization layer.

In accordance with the object of this invention, a new method of planarizing an integrated circuit is achieved. A first coating of a silicate spin-on-glass material is applied to the surface of a patterned conductor layer to be planarized. The spin-on-glass material is applied under low relative humidity, filling the valleys of the irregular structure of the conductor layer. The first spin-on-glass layer is covered with a second coating of the spin-on-glass material also applied under low relative humidity. Then, both first and second spin-on-glass layers are cured. This method provides a uniform spin-on-glass dielectric layer upon which a second conductor layer may now be successfully applied.

BRIEF DESCRIPTION OF THE DRAWINGS

In the accompanying drawings forming a material part of this description, there is shown.

DESCRIPTION OF THE PREFERRED EMBODIMENTS

Figure 1:
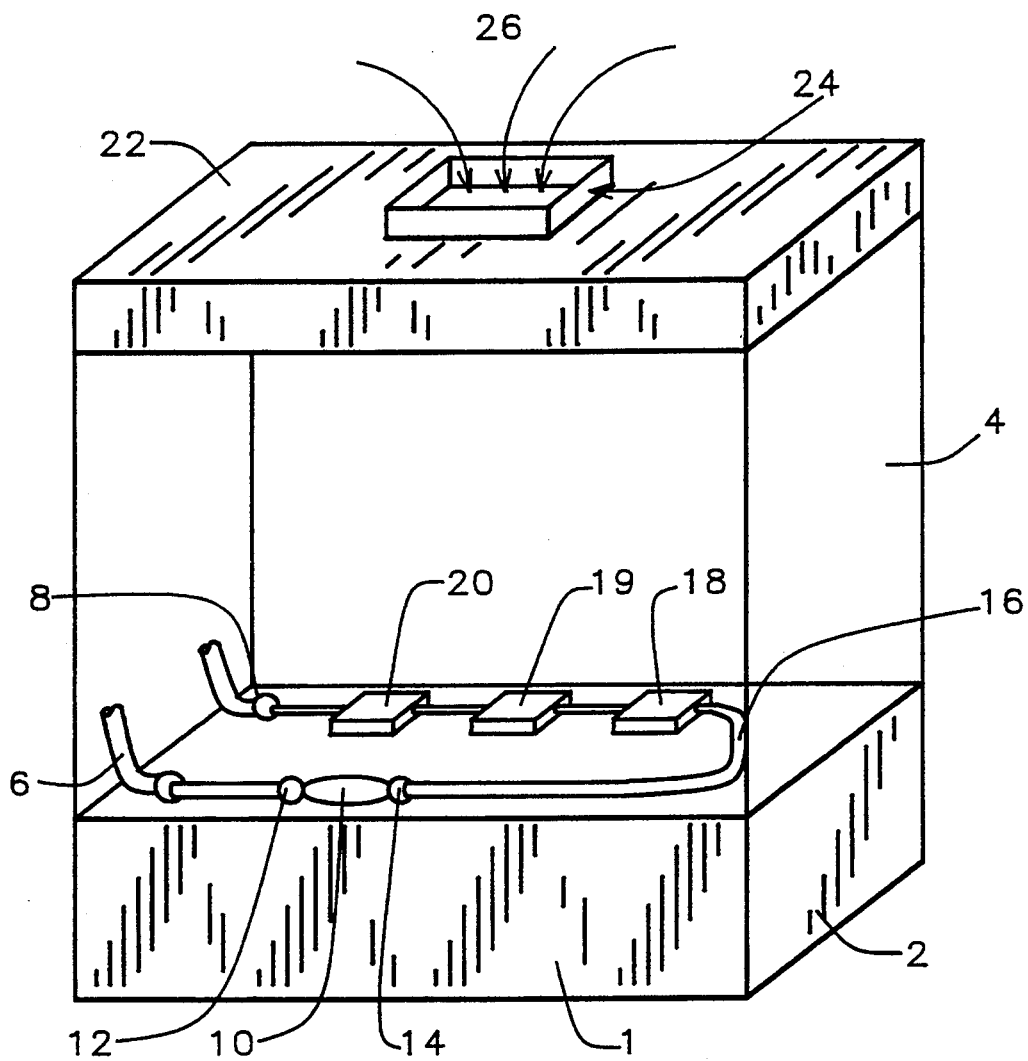
FIG. 1 schematically illustrates in cross-sectional representation a spin-on-glass machine and dehumidifier used in the present invention.

Referring now more particularly to FIG. 1, there is shown an illustration of a spin-on-glass machine 1. The machine is within a stainless steel chamber 2 with glass panels 4 above. Wafers are loaded into the chamber at 6 and removed at 8. The wafers are loaded one at a time by the wafer on-load handler 12 onto the coater-spinner table 10. The dehumidifier 22 is shown on top of the spin-on-glass chamber. The control panel of the dehumidifier is next to the chamber, not shown. Air 26 flows into the top of the humidity control unit 24 which keeps the air at a critical relative humidity of less than 35%. A relative humidity of 30% or less is preferred. Spin-on-glass cracks will be found due to a too low relative humidity, on the order of 10%. However, surprisingly, it has been found that the critical relative humidity levels will prevent the formation of cracks in the spin-on-glass. The typical fabrication factory ambient relative humidity is about 45% plus or minus 5%, so the relative humidity of the process must be positively controlled using, for example, the dehumidifier.

A silicate spin-on-glass material coats the wafer on the coater/spinner table 10. It has been found that siloxane spin-on-glass material is not helped by the low relative humidity of the present invention. In experimentation, it has been discovered that a double coat of silicate spin-on-glass in excess of 6000 Angstroms in thickness will show signs of cracking. Therefore, each coating of silicate spin-on-glass must be less than about 2800 Angstroms.

After coating and spinning the spin-on-glass material on the wafer, the wafer off-load handler 14 removes the wafer from the plate 10 and loads it onto the moving belt 16. The wafer travels to the three hotplates 18, 19, and 20 in order for the baking step. The wafer remains on each hotplate for about 60 seconds. The temperatures of the hotplates are about 75°–85°, 145°–180°, and 215°–275° C., in order.

The wafer is removed from the spin-on-glass machine and cooled for about an hour, then loaded again onto the coater/spinner table 10. A second coating of silicate spin-on-glass is applied. The wafer is spun and sent to the hot plates again for the baking of the second layer. The wafer is removed from the spin-on-glass machine and cured in a 420° C. furnace.

Figure 2:
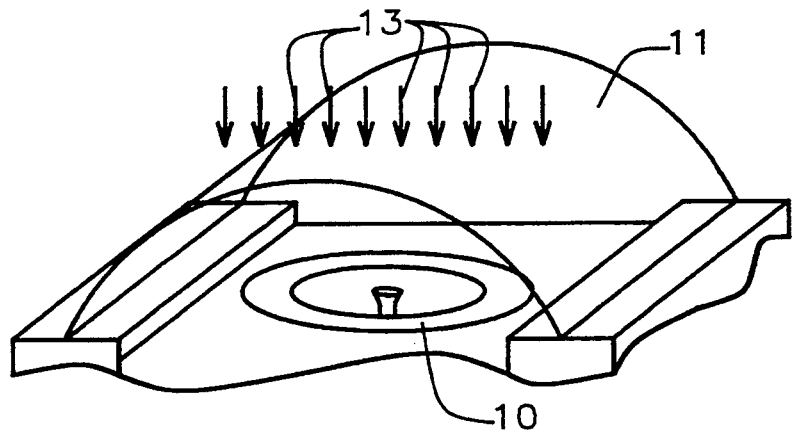
FIG. 2 schematically illustrates in cross-sectional representation a spin-on-glass coating apparatus enclosed by a humidity controller chamber.

An alternative to the humidity controlled spin-on-glass machine illustrated in FIG. 1 is that illustrated in FIG. 2. Here, the humidity is controlled only when the wafer is on the coater/spinner table 10. Dry nitrogen gas 13 is flowed into the enclosure 11 to keep the relative humidity at less than the critical 35%, and preferably 30% or less. This is not a good pattern of gases as is the first embodiment of FIG. 1, because the pattern of gases will influence the uniformity of the liquid pattern. A laminar air flow and dehumidified air could be used as in the total environment alternative of FIG. 1.

The spin-on-glass reaction can be characterized as follows:

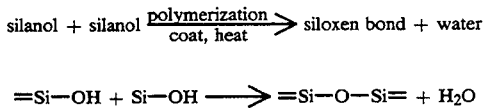

$$=Si-OH + Si-OH \longrightarrow =Si-O-Si= + H_2O$$

In the low relative humidity environment of the present invention, the water byproduct of the reaction is decreased.

Table 1 compares the results of the low humidity process of the present invention to the double cure process of an alternative solution to the non-uniformity problem.

TABLE 1

|  | Low Humidity | Double Cure |
| --- | --- | --- |
| non-uniformity | ok | ok |
| thermal budget | only one 420° C. cure | cure twice |
| enhance metal-1 void | better | worse |
| contact spiking | better | worse |
| cost | low | high |
| cycle time | shorter | longer |

A greater thermal cycle will improve the metal-1 void and contact spiking. In the case of the double cure, the additional thermal treatment for the additional cure will deplete the thermal budget for the backend process. Thermal budget is defined as the amount of heat that can be used during a process (such as the backend process) without causing the devices of the integrated circuit to go out of specification due to the movement of dopants during the heating steps.

Both the double cure process and spin-on-glass coating in low humidity can solve the spin-on-glass non-uniformity problem. Spin-on-glass coating in low humidity has the advantages over the double cure process of lower cost, shorter cycle time, more backend thermal budget, and simple operation.

While the invention has been particularly shown and described with reference to the preferred embodiments thereof, it will be understood by those skilled in the art that various changes in form and details may be made without departing from the spirit and scope of the invention.

What is claimed is:

1. The method of planarizing the dielectric layers between conductor layers in submicron integrated circuits comprising:
   providing semiconductor device structures in and on a semiconductor substrate;
   providing at least one patterned conductive layer for contacting the active elements of said device structures;
   wherein the surface of said patterned conductive layer structure is irregular with horizontal and vertical components;
   covering said patterned conductor layer with a first coating of a spin-on-glass material applied under relative humidity of less than about 35% wherein said spin-on-glass material fills the valleys of said irregular structure;
   covering said first spin-on-glass layer with a second coating of said spin-on-glass material applied under relative humidity of less than about 35%;
   simultaneously curing both said first and second spin-on-glass layers wherein said spin-on-glass layers provide and even coating; and
   depositing a second conductor layer over said spin-on-glass layers to complete said planarization.

2. The method of claim 1 wherein said spin-on-glass material is a silicate.

3. The method of claim 2 wherein each of said first and second spin-on-glass layers are less than about 2800 Angstroms in thickness.

4. The method of claim 1 wherein said low relative humidity is less than or equal to 30%.

5. The method of claim 1 wherein said first and second spin-on-glass coatings are applied within a humidity controller chamber.

6. The method of planarizing the dielectric layers between conductor layers in submicron integrated circuits by using silicate spin-on-glass material comprising:
   providing semiconductor device structures in and on a semiconductor substrate;
   providing at least one patterned conductive layer for contacting the active elements of said device structures;
   wherein the surface of said patterned conductive layer structure is irregular with horizontal and vertical components;
   covering said patterned conductor layer with a first coating of a silicate type spin-on-glass material applied under relative humidity of less than about 35% wherein said spin-on-glass material fills the valleys of said irregular structure;
   covering said first spin-on-glass layer with a second coating of said spin-on-glass material applied under relative humidity of less than about 35%;
   wherein each of said first and second spin-on-glass layers are less than about 2800 Angstroms in thickness;
   simultaneously curing both said first and second spin-on-glass layers wherein said spin-on-glass layers provide and even coating; and
   depositing a second conductor layer over said spin-on-glass layers to complete said planarization.

7. The method of claim 6 wherein said low relative humidity is less than or equal to 30%.

8. The method of claim 6 wherein said first and second spin-on-glass coatings are applied within a humidity controller chamber with dehumidified air.

9. The method of claim 8 wherein the dehumidified air is flowed laminarly from the top of said chamber to the location where said spin-on-glass coating are applied.

* * * * *